(12) United States Patent
Fujioka et al.

(10) Patent No.: US 6,452,453 B1
(45) Date of Patent: Sep. 17, 2002

(54) CONSTANT-CURRENT GENERATOR, DIFFERENTIAL AMPLIFIER, AND SEMICONDUCTOR INTEGRATED CIRCUIT

(75) Inventors: Shinya Fujioka; Akihiro Funyu, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/562,289

(22) Filed: May 1, 2000

(30) Foreign Application Priority Data

Jul. 12, 1999 (JP) .......................................... 11-197681

(51) Int. Cl.[7] ............................................... H03F 3/04
(52) U.S. Cl. ........................ 330/288; 330/257; 323/315
(58) Field of Search ................................. 330/257, 288; 323/315, 316

(56) References Cited

U.S. PATENT DOCUMENTS

| | | | | |
|---|---|---|---|---|
| 5,001,482 A | * | 3/1991 | Chung et al. ............... | 330/288 |
| 5,818,295 A | * | 10/1998 | Chimura et al. ............ | 330/257 |
| 5,874,852 A | * | 2/1999 | Brambilla et al. .......... | 330/288 |
| 5,952,884 A | * | 9/1999 | Ide .............................. | 330/288 |
| 6,023,157 A | * | 2/2000 | Kazuno ...................... | 323/316 |
| 6,034,567 A | * | 3/2000 | Umezawa et al. .......... | 330/261 |
| 6,037,762 A | * | 3/2000 | Koelling et al. ............ | 323/313 |
| 6,075,405 A | * | 6/2000 | Nishino et al. ............. | 323/315 |
| 6,194,967 B1 | * | 2/2001 | Johnson et al. ............. | 330/288 |

FOREIGN PATENT DOCUMENTS

| | | | | |
|---|---|---|---|---|
| JP | | 356152015 A | * 11/1981 | ................. 323/265 |

* cited by examiner

*Primary Examiner*—Robert Pascal
*Assistant Examiner*—Khanh Van Nguyen
(74) *Attorney, Agent, or Firm*—Arent Fox Kintner Plotkin & Kahn, PLLC (57) ABSTRACT

The constant-current generator comprises a bias transistor whose drain and gate are connected to each other, and an outputting transistor. The threshold voltage of the outputting transistor is smaller than that of the bias transistor. The outputting transistor has the same source voltage and the same gate voltage as those of the bias transistor. Therefore, the gate-to-source voltages of the outputting transistor and the bias transistor are always kept equal. On the other hand, the drain-to-source current of the outputting transistor becomes larger than that of the bias transistor in accordance with the difference between the threshold voltages of the outputting transistor and the bias transistor. Accordingly, the outputting transistor can output a stable drain-to-source current even when the drain voltage of the bias transistor has shifted to lower the gate-to-source voltage thereof.

8 Claims, 13 Drawing Sheets

CONSTANT-CURRENT GENERATOR, DIFFERENTIAL AMPLIFIER, AND SEMICONDUCTOR INTEGRATED CIRCUIT

BACKGROUND OF THE INVENTION

1. Field of the Invention

The present invention relates to a constant-current generator and a differential amplifier which depend little upon a power source voltage, and a semiconductor integrated circuit which includes the differential amplifier.

2. Description of the Related Art

Semiconductor integrated circuits, such as microcomputers and DRAMs, have had their operating speeds heightened year by year. There has been developed, for example, an SDRAM (Synchronous DRAM) in which an input/output interfacing circuit is operated at high speed in synchronization with a clock signal, thereby to write/read data at high speed.

Figure 1:
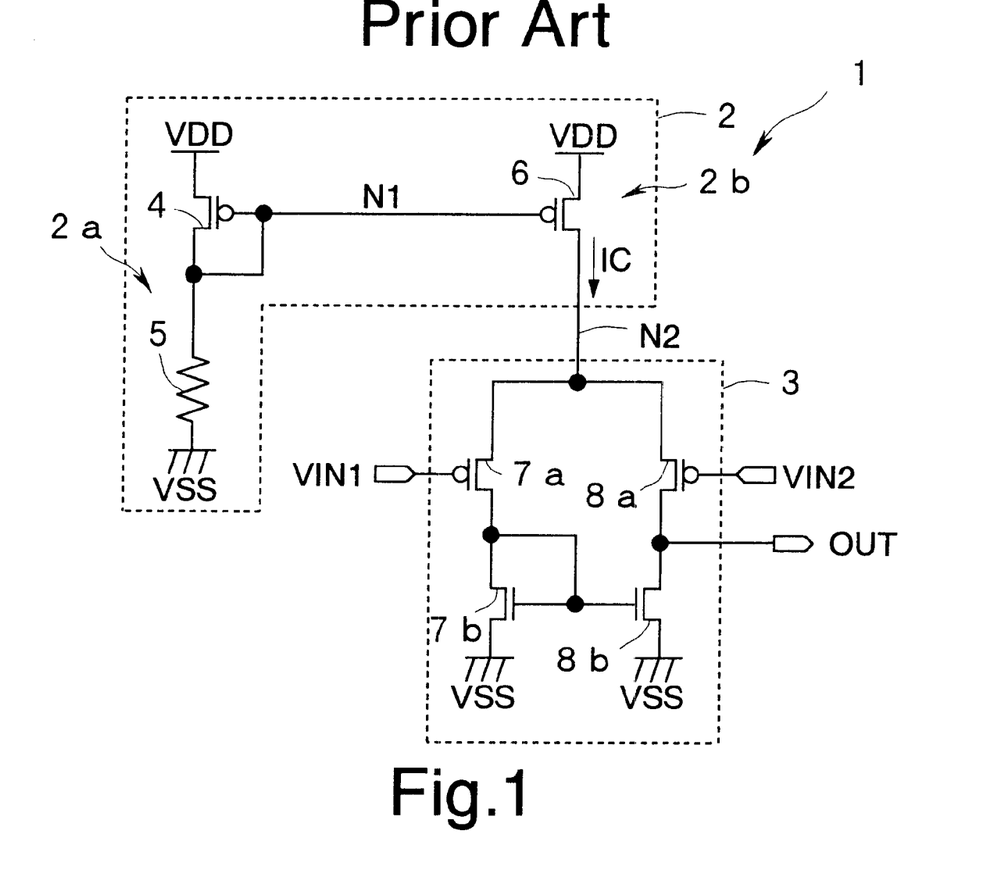
FIG. 1 is a circuit diagram showing an input buffer in the prior art.

FIG. 1 shows an input buffer which is used in the semiconductor integrated circuit of this kind.

The input buffer 1 is constructed of a constant-current generator 2 including a bias part 2a and a driver part 2b, and a differential amplifier 3.

The bias part 2a is formed of a pMOS transistor 4, and a resistor 5 having a high resistance. The pMOS transistor 4 has its source connected to a power supply line VDD, and has its drain and gate connected to a node N1. The resistor 5 has its one end connected to the node N1, and has its other end connected to a ground line VSS. The driver part 2b is formed of a PMOS transistor 6. The pMOS transistor 6 has its source connected to the power supply line VDD, has its gate connected to the node N1, and has its drain connected to a node N2 being the common source of the differential amplifier 3. The PMOS transistors 4, 6 are formed having equal sizes at proximate positions, and the threshold voltages VT1 thereof are equalized. The constant-current generator 2 is constructed as a current mirror circuit.

The differential amplifier 3 includes a PMOS transistor 7a and an nMOS transistor 7b which are connected in series, and a PMOS transistor 8a and an nMOS transistor 8b which are also connected in series. Herein, a current mirror circuit is constructed of the transistors 7b, 8b. More specifically, the PMOS transistor 7a has its source connected to the node N2 and its drain connected to the drain and gate of the nMOS transistor 7b, and it receives an input signal VIN1 at its gate. The pMOS transistor 8a has its source connected to the node N2 and its drain connected to the drain of the nMOS transistor 8b, and it receives an input signal VIN2 at its gate. An output signal OUT is outputted from the common drain of the PMOS transistor 8a and the nMOS transistor 8b. The sources of the nMOS transistors 7b, 8b are connected to the ground line VSS.

Hereinbelow, the PMOS transistor and nMOS transistor shall be simply termed the "pMOS" and "nMOS", respectively. In addition, the symbols VDD and VSS shall also denote a power supply voltage and a ground voltage, respectively.

Figure 2:
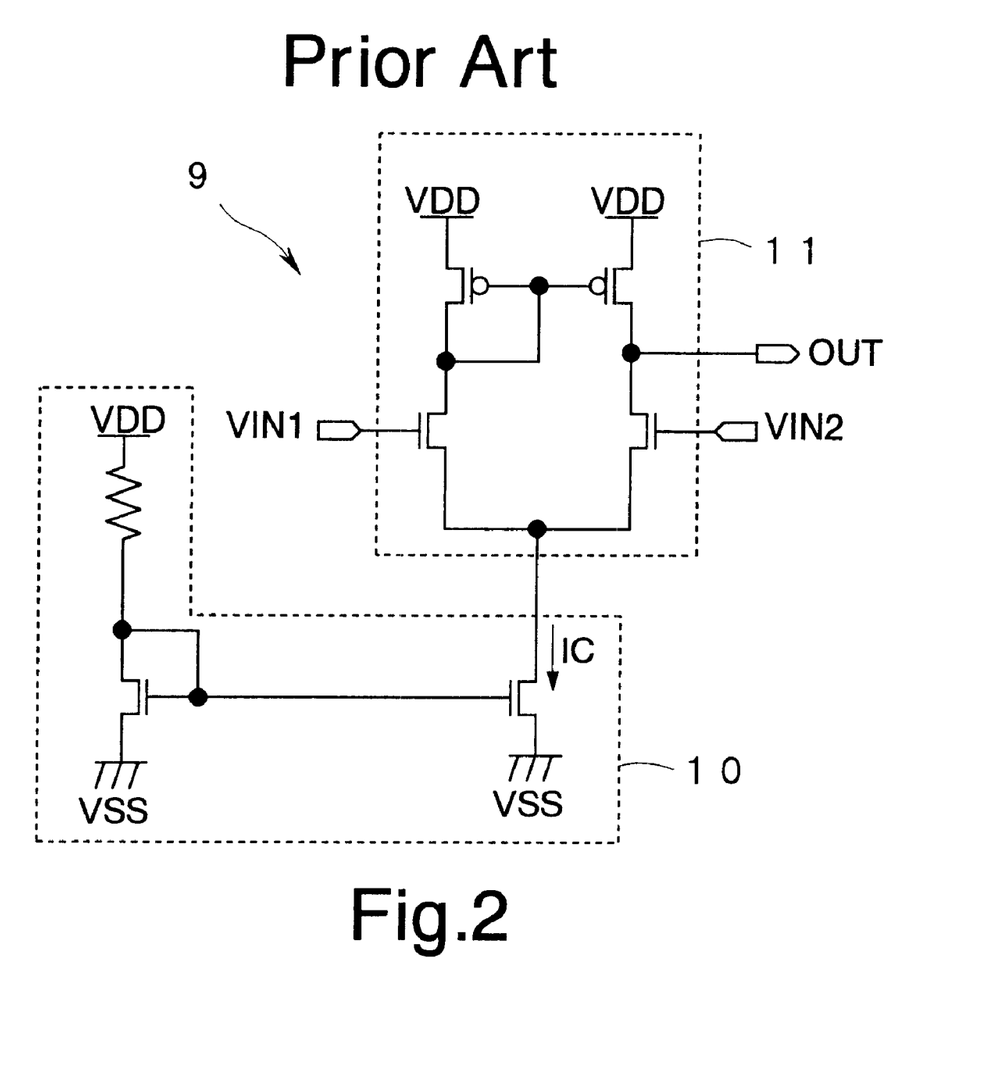
FIG. 2 is a circuit diagram showing another input buffer in the prior art.

FIG. 2 shows another input buffer 9.

The input buffer 9 is configured of a constant-current circuit 10 in which a current mirror circuit is constructed of nMOSs (nMOS transistors), and a differential amplifier 11 in which a current mirror circuit is constructed of pMOSs (PMOS transistors). The input buffer 9 is such a circuit that the pMOSs and nMOSs of the input buffer 1 are replaced with each other, and that the power supply voltage VDD and the ground voltage VSS are replaced with each other.

Next, the operation of the input buffer 1 will be explained. Complementary clock signals supplied from the exterior, for example, are applied as the input signals VIN1, VIN2 to the input buffer 1 shown in FIG. 1.

The bias part 2a of the constant-current generator 2 generates a predetermined voltage V1 at the node N1 by the action of the pMOS 4 and the resistor 5. Here, the resistance of the resistor 5 is set so that the voltage V1 may become a value "(Power supply voltage VDD)−(Threshold voltage |VT1|)−−(Margin α)". Thus, the pMOSs 4, 6 are reliably turned on owing to the margin α.

Figure 3:
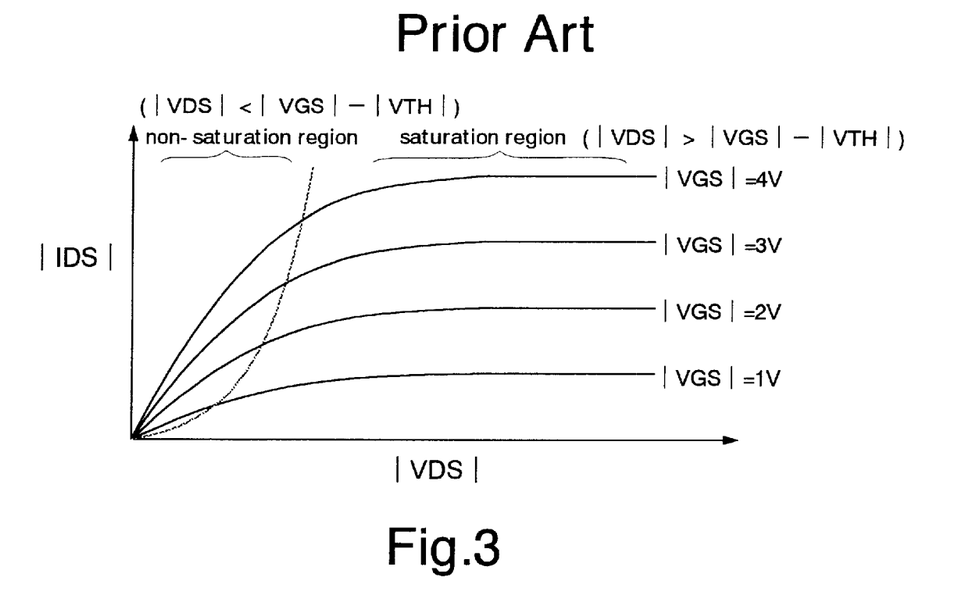
FIG. 3 is a graph showing the static characteristics of a pMOS transistor.

A constant supply current IC is fed to the differential amplifier 3 by the turn-on operation of the PMOS 6. Here, the differential amplifier 3 is designed so that the voltage V2 of the node N2 may become smaller than a value "(Power supply voltage VDD)−(Voltage V1)+(Threshold voltage |VT1|)". Therefore, the pMOS 6 operates in the saturation region of static characteristics as shown in FIG. 3. Accordingly, the supply current IC hardly changes even when the voltage V2 of the node N2 has changed to some extent under the influence of the operation of the differential amplifier 3.

Figure 4:
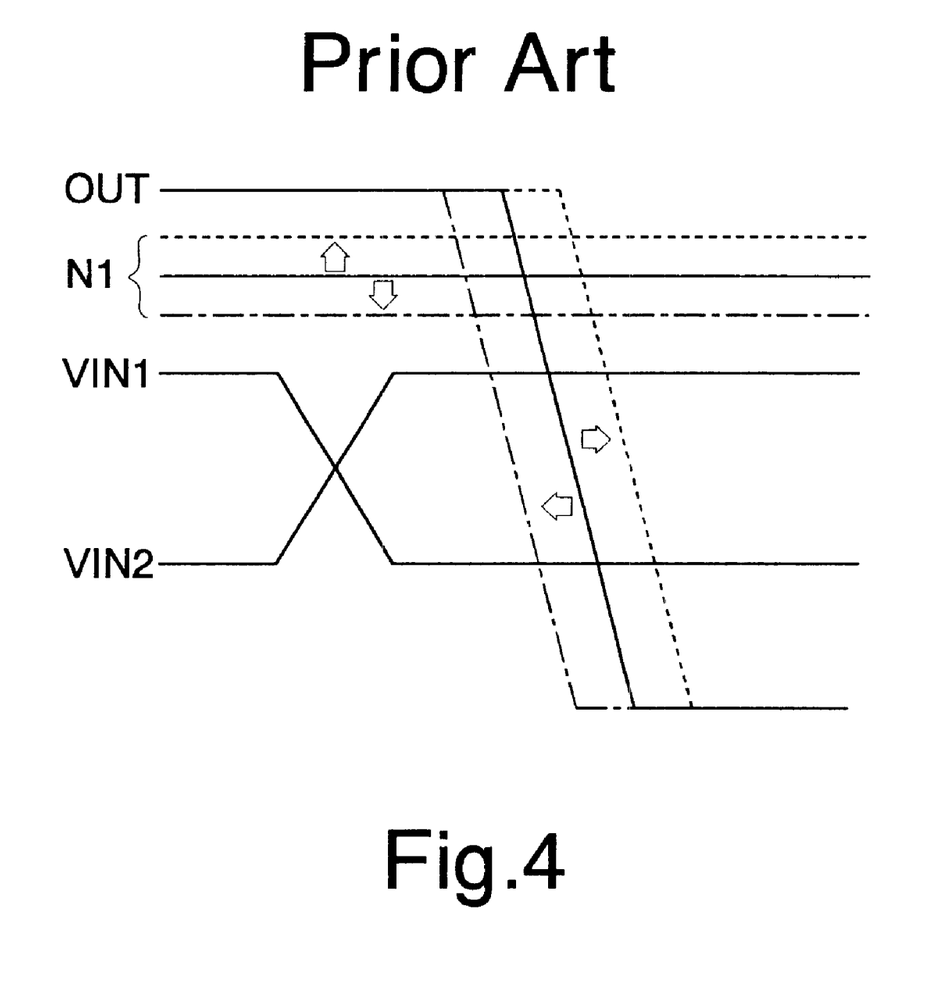
FIG. 4 is a timing chart showing the operation of the prior-art input buffer shown in FIG. 1.

As shown in FIG. 4, the differential amplifier 3 receives the input signals VIN1, VIN2 and outputs a differentially amplified signal as the output signal OUT.

Also in the input buffer 9 shown in FIG. 2, an operation similar to that of the input buffer 1 proceeds to differentially amplify input signals VIN1, VIN2 and to produce an output signal OUT.

Meanwhile, SDRAMs have recently become higher in the frequency of a clock signal. Further, with a DDR-SDRAM (Double Data Rate-Synchronous DRAM), data signals are inputted/outputted in synchronization with the respective rises of complementary clock signals. Therefore, in the SDRAM and the DDR-SDRAM, power supply noise is more liable to occur than in the conventional DRAM. Besides, the voltage drops due to increases in current which flows through power supply line and ground line. In consequence, a power supply voltage VDD and a ground voltage VSS are liable to shift. Concretely, the power supply voltage VDD and the ground voltage VSS respectively differ at distant positions within a chip.

By way of example, in a case where the ground voltage VSS has shifted toward a plus side in the input buffer 1 shown in FIG. 1, the voltage V1 of the node N1 rises as indicated by a broken line in FIG. 4. The supply current IC which is fed to the differential amplifier 3 decreases due to the rise of the voltage V1, so that the speed of the differential amplification of the input signals VIN1, VIN2 lowers. This results in the problem that the output timing of the output signal OUT lags as indicated by a broken line.

On the other hand, in a case where the ground voltage VSS has shifted toward a minus side, the voltage V1 of the node N1 falls as indicated by a dot-and-dash line. The supply current IC which is fed to the differential amplifier 3 increases due to the fall of the voltage V1. This incurs the problem that the output timing of the output signal OUT advances as indicated by a dot-and-dash line.

As a result, the timing margin of the circuitry narrows to make the timing design thereof difficult.

Also in the input buffer 9 shown in FIG. 2, when the power supply voltage VDD has shifted, problems similar to the above occur to narrow the timing margin of the circuitry.

SUMMARY OF THE INVENTION

An object of the present invention is to provide a constant-current generator whose supply current does not fluctuate even when a ground voltage VSS or a power supply voltage VDD has shifted.

Another object of the present invention is to provide a differential amplifier whose amplifying speed does not fluctuate even when a ground voltage VSS or a power supply voltage VDD has shifted.

Still another object of the present invention is to provide a semiconductor integrated circuit which includes a differential amplifier free from the fluctuation of the amplifying speed.

According to one of the aspects of the constant-current generator in the present invention, the generator comprises a bias transistor whose drain and gate are connected to each other, and an outputting transistor. The threshold voltage of the outputting transistor is smaller than that of the bias transistor. The outputting transistor has the same source voltage and the same gate voltage as those of the bias transistor. Therefore, the gate-to-source voltages of the outputting transistor and the bias transistor are always kept equal. On the other hand, the drain-to-source current of the outputting transistor becomes larger than that of the bias transistor in accordance with the difference between the threshold voltages of the outputting transistor and the bias transistor. Accordingly, the outputting transistor can output a stable drain-to-source current even when the drain voltage of the bias transistor has shifted to lower the gate-to-source voltage thereof.

According to another aspect of the constant-current generator in the present invention, the drain of the bias transistor is connected to a voltage generator. The voltage generator supplies a predetermined voltage to the drain of the bias transistor so as to set the drain-to-source voltage of the bias transistor larger than the threshold voltage thereof. Therefore, the drain voltage of the bias transistor approaches the source voltage thereof. Accordingly, the bias transistor is less affected by the shifting in the power source voltage.

By way of example, in a case where the bias transistor is a pMOS transistor, it is less affected by the shifting in a ground voltage. Since the bias transistor is in diode connection, it is also less affected by the shifting in the power source voltage. On the other hand, in a case where the bias transistor is an nMOS transistor, it is less affected by the shifting in the power source voltage. As a result, the outputting transistor can output a constant drain-to-source current in spite of the shifting in the power source voltage.

According to still another aspect of the constant-current generator in the present invention, the drain-to-source voltage of the bias transistor is easily generated by using a resistor.

According to yet another aspect of the constant-current generator in the present invention, a voltage controlling unit prevents the drain voltage of the bias transistor from shifting due to the shifting in the power source voltage. Therefore, the drain voltage of the bias transistor is held at a predetermined value without being affected by the shifting in the power source voltage. As a result, the outputting transistor can output the constant current irrespective of the shifting in the power source voltage.

According to yet another aspect of the constant-current generator in the present invention, the generator comprises a bias transistor whose drain and gate are connected to each other, an outputting transistor, and a voltage generator connected to the drain of the bias transistor. The outputting transistor has the same source voltage and the same gate voltage as those of the bias transistor. The voltage generator supplies a predetermined voltage to the drain of the bias transistor so as to set the drain-to-source voltage of the bias transistor larger than the threshold voltage thereof. Further, the voltage controlling unit of the voltage generator prevents the drain voltage of the bias transistor from shifting due to the shifting in the power source voltage. Therefore, the drain voltage of the bias transistor is held at a predetermined value without being affected by the shifting in the power source voltage. As a result, the outputting transistor can output a constant drain-to-source current irrespective of the shifting in the power source voltage.

According to one of the aspects of the differential amplifier in the present invention, a supply current from a constant-current generator is always kept constant irrespective of the shifting in the power source voltage, so that the amplifying speed of signals differentially inputted can always be kept constant, thereby to prevent the output timing of the amplified signal from shifting.

According to one of the aspects of the semiconductor integrated circuit in the present invention, the output timing of a signal amplified by a differential amplifier is held constant so that the timing margin of circuit is prevented from narrowing.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Now, the embodiments of the present invention will be described with reference to the drawings.

Figure 5A:
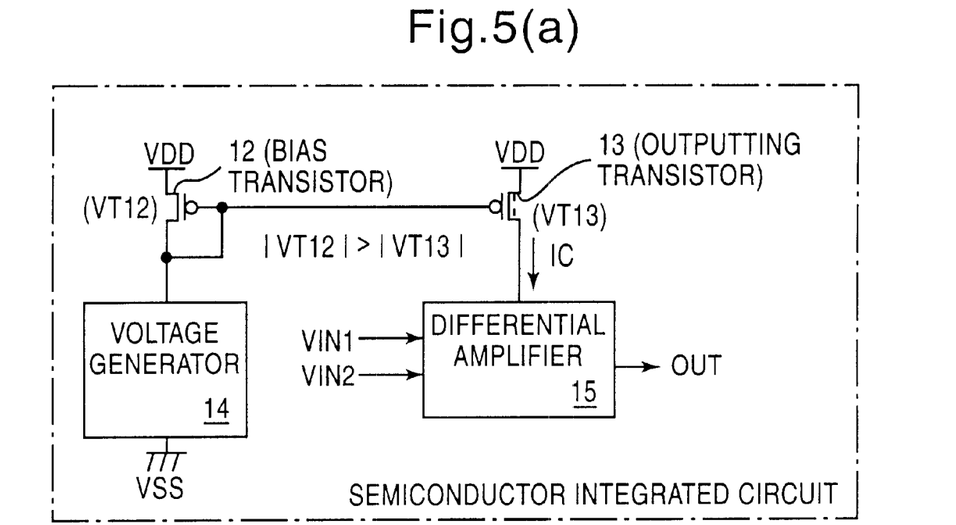
FIGS. 5a and 5b are block diagrams showing the basic principle of the fourth embodiment of the present invention.
Figure 5B:
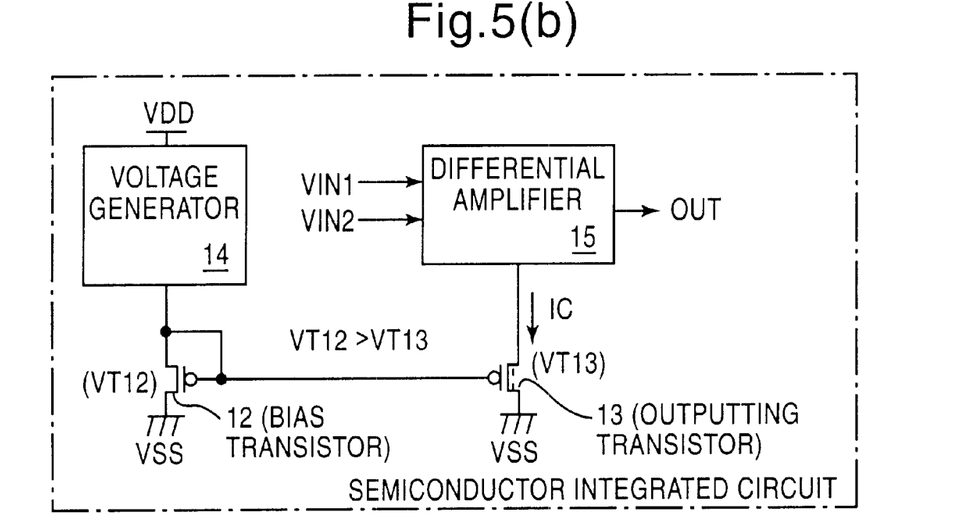

FIGS. 5a and 5b are block diagrams showing the basic principle of the first through third embodiments and the fifth embodiment of a constant-current generator, a differential amplifier, and a semiconductor integrated circuit according to the present invention. In FIG. 5a, the circuit is preferably constructed by PMOS transistors.

The semiconductor integrated circuit comprises the differential amplifier which uses the constant-current generator as a current source. The constant-current generator includes a bias transistor 12 whose drain and gate are connected to each other, and an outputting transistor 13. The threshold voltage VT13 of the outputting transistor 13 is smaller than the threshold voltage VT12 of the bias transistor 12. The outputting transistor 13 is fed the same source voltage and the same gate voltage as those of the bias transistor 12.

The drain of the bias transistor 12 is connected to a voltage generator 14. The voltage generator 14 supplies a predetermined voltage to the drain of the bias transistor 12 so as to set the drain-to-source voltage of the bias transistor 12 slightly larger than the threshold voltage VT12 thereof.

Figure 6:
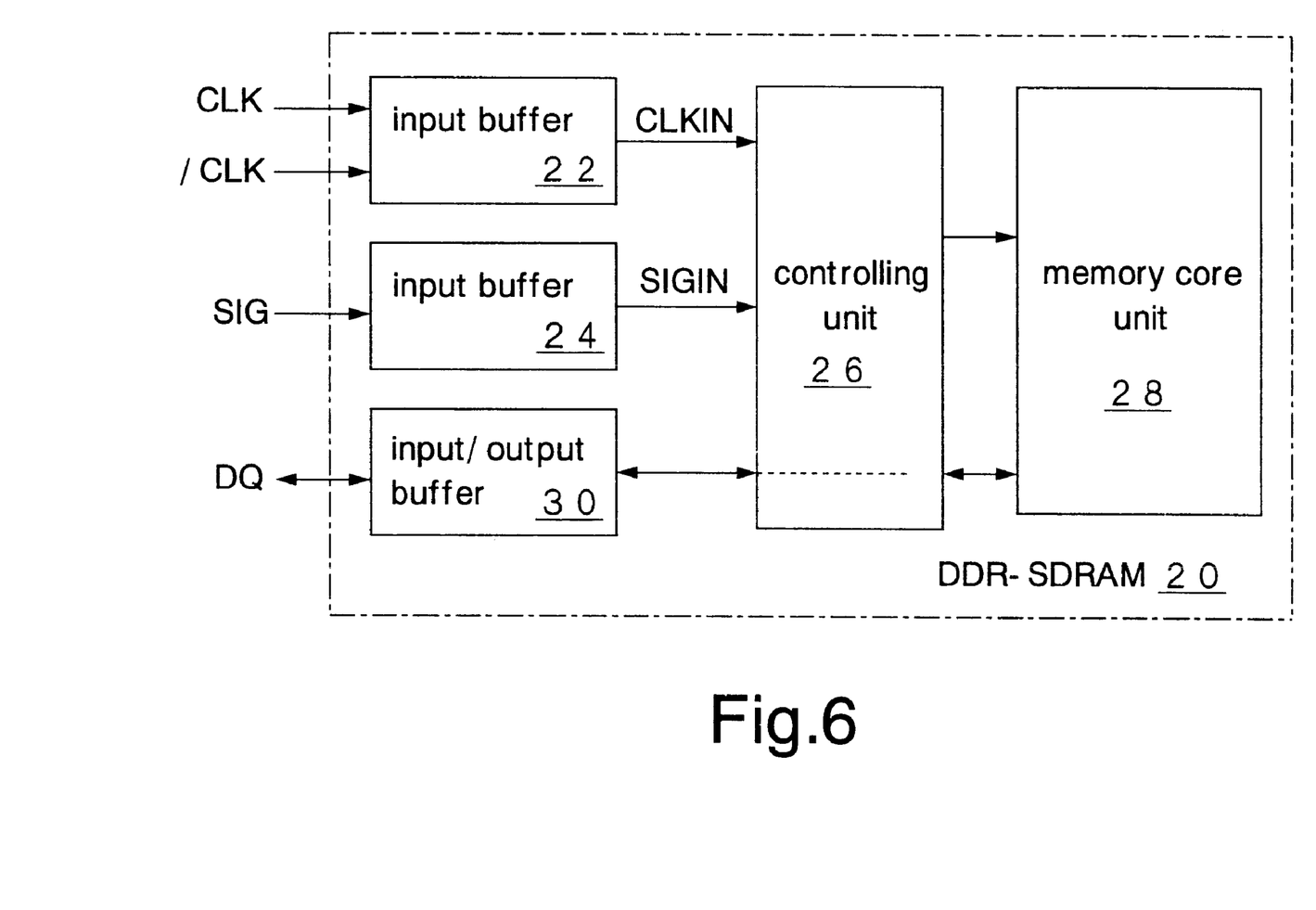
FIG. 6 is a block diagram showing the first embodiment of the present invention.

FIG. 6 shows the first embodiment of the constant-current generator, the differential amplifier and the semiconductor integrated circuit according to the present invention.

The semiconductor integrated circuit in this embodiment is formed as, for example, a DDR-SDRAM 20 on a silicon substrate by the use of CMOS process technology. The DDR-SDRAM 20 inputs/outputs data signals in synchronization with the rises of complementary clock signals CLK, /CLK, respectively.

By the way, the same circuits as those mentioned in the explanation of the prior art are designated by the same reference numerals and symbols, and they shall be omitted from detailed description.

The DDR-SDRAM 20 comprises an input buffer 22 for accepting the clock signals CLK, /CLK supplied from the exterior, a plurality of input buffers 24 for accepting input signals SIG, a controlling unit 26, a memory core unit 28, and a plurality of input/output buffers 30 for inputting/outputting the data signals DQ. The signals accepted by the input buffers 22 and 24 are respectively output to the controlling unit 26 as an internal clock signal CLKIN and internal signals SIGIN.

Figure 7:
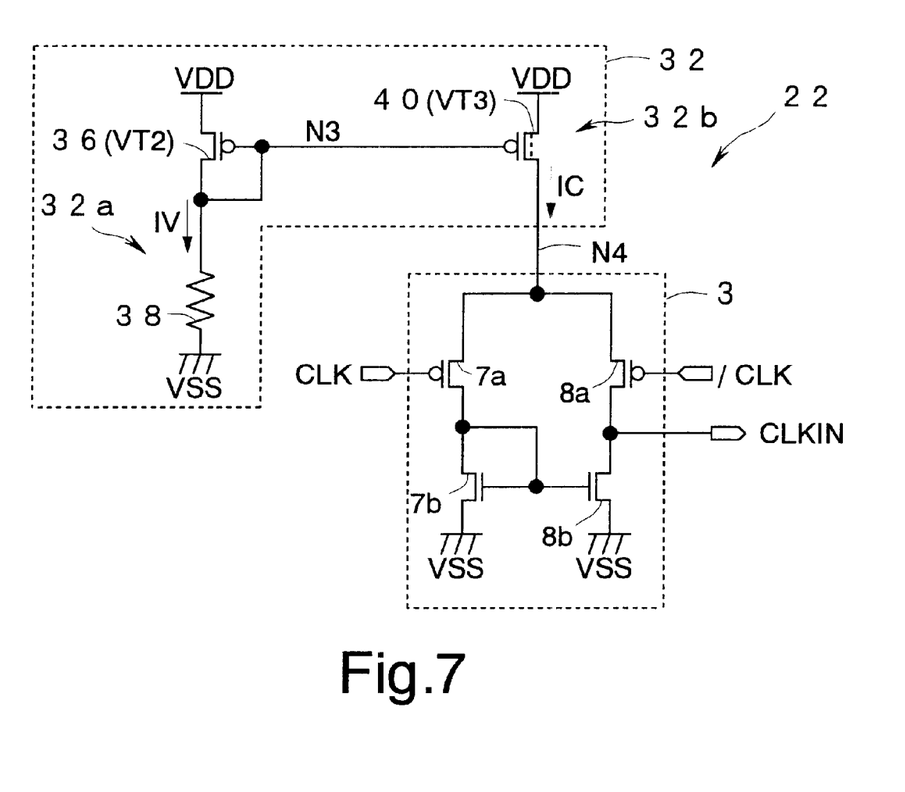
FIG. 7 is a circuit diagram showing an input buffer of the first embodiment of the present invention.

FIG. 7 shows the details of the input buffer 22.

The input buffer 22 is constructed of a constant-current generator 32 including a bias part 32a and a driver part 32b, and a differential amplifier 3. The differential amplifier 3 is the same circuit as in the prior art.

The bias part 32a of the input buffer 22 is formed of a pMOS 36, and a resistor 38 having a high resistance. The pMOS 36 corresponds to the bias transistor, while the resistor 38 corresponds to the voltage generator. The threshold voltage of the pMOS 36 is set at a value VT2. The PMOS 36 has its source connected to a power supply line VDD, and has its drain and gate connected to a node N3. The resistor 38 has its one end connected to the node N3, and has its other end connected to a ground line VSS. The resistor 38 is formed using, for example, an n-type diffusion layer. The resistance of the resistor 38 is set higher to some extent relative to the on-resistance of the PMOS 36. Concretely, the resistance of the resistor 38 is set so that the voltage V3 of the node N3 may become slightly lower than a value "(Power supply voltage VDD)−(Threshold voltage |VT2|)". That is, the voltage V3 hardly contains the "margin α" having been contained in the prior art.

The driver part 22b is formed of a PMOS 40. The PMOS 40 corresponds to the outputting transistor. This pMOS 40 has its source connected to the power supply line VDD, has its gate connected to the node N3, and has its drain connected to a node N4 being the common source of the differential amplifier 3. The threshold voltage VT3 of the PMOS 40 is set to be lower than that VT2 of the PMOS 36. The threshold voltage VT3 of the PMOS 40 is adjusted by, for example, implanting the ions of boron or the like into the channel area of this pMoS before forming the gate thereof. In addition, the threshold voltages VT2, VT3 can be adjusted by changing the channel lengths of the respective pMOSs 36, 40. Since the pMOS 40 has its threshold voltage VT3 set lower, it has a predetermined current supplying capability without the "margin α" having hitherto been necessary for the voltage V3. Moreover, the threshold voltage VT3 is lower, so the voltage V3 can approach the power supply voltage VDD by setting the resistance of the resistor 38 higher. As a result, the voltage V3 is less affected by the shifting in the ground voltage VSS.

The sources of the pMOSs 7a, 8a of the differential amplifier 3 are connected to the node N4. The gates of the pMOSs 7a, 8a receive the clock signals CLK, /CLK, respectively. The common drain of the pMOS 8a and an nMOS 8b outputs the internal clock signal CLKIN.

Besides, the input buffer 24 shown in FIG. 6 is the same circuit as the input buffer 22. Although note specially shown, the input buffer 24 receives an input signal DIN by the gate of the pMOS 7a of the differential amplifier 3, is fed a reference voltage by the gate of the pMOS 8a, and outputs the internal signal SIGIN.

Next, the operation of the input buffer 22 stated above will be described.

In the bias part 32a of the constant-current generator 32, the predetermined voltage V3 is generated at the node N3 by the PMOS 36 and the resistor 38. As described above, the voltage V3 becomes slightly lower than the values "(Power supply voltage VDD)−(Threshold voltage |VT2|)".

The pMOS 36 generates a predetermined bias current IV. The supply current IC in accordance with the voltage V3 flows through the pMOS 40. Here, the threshold voltage VT3 of the pMOS 40 is lower than that VT2 of the pMOS 36. Therefore, the supply current IC is larger than the bias current IV in spite of the equal gate-to-source voltages of the pMOSS 36, 40. This supply current IC is fed to the differential amplifier 3.

The resistance of the resistor 38 is higher, and the voltage V3 of the node N3 is close to the power supply voltage VDD, so that the voltage V3 is less affected by the shifting in the ground voltage VSS even when this ground voltage VSS has been raised or lowered by the operation of any other circuit. That is, the voltage V3 of the node N3 shifts a little, and the supply current IC is kept constant irrespective of the shifting in the ground voltage VSS.

The differential amplifier 3 is designed so that the voltage V4 of the node N4 may become smaller than a value "(Power supply voltage VDD)−(Voltage V3)+(Threshold voltage |VT3|)". Therefore, the pMOS 40 operates in the saturation region thereof. Accordingly, the supply current IC hardly changes even when the voltage V4 of the node N4 has changed to some extent under the influence of the operation of the differential amplifier 3.

Furthermore, the differential amplifier 3 receives the clock signals CLK, /CLK and outputs a differentially amplified signal as the internal clock signal CLKIN. Here, as described above, the voltage V3 and the supply current IC hardly fluctuate even when the ground voltage VSS has shifted. Therefore, the generation timing of the internal clock signal CLKIN which is generated by the differential amplifier 3 does not shift, and the timing margin of the circuitry does not narrow.

Incidentally, in the input buffer 24 shown in FIG. 6, the generation timing of the internal signal SIGIN does not shift same as in the input buffer 22 when the ground voltage VSS has shifted.

In the constant-current generator of the present invention thus far described, the threshold voltage VT3 of the pMOS 40 of the driver part 32b is set smaller than that VT2 of the PMOS 36 of the bias part 32a. Therefore, even when the shifting in the ground voltage VSS due to a voltage drop or the like results in lowering the gate-to-source voltages of the pMOSs 36, 40, the pMOS 40 can feed the stable supply current IC to the differential amplifier 3.

The resistance of the resistor 38 is set higher to some extent than the on-resistance of the pMOS 36 to approach the voltage V3 of the node N3 to the power supply voltage VDD. It is therefore possible to lessen the shifting in the voltage V3 of the node N3 attributed to the shifting in the ground voltage VSS. As a result, the PMOS 40 can always feed the constant supply current IC to the differential amplifier 3.

In the differential amplifier 3 of the present invention, the constant-current generator 32 is employed as the current source. Therefore, the amplifying speed of the clock signals CLK, /CLK differentially inputted can be always kept constant irrespective of the shifting in the ground voltage VSS. It is accordingly possible to prevent the output timing of the amplified internal clock signal CLKIN from shifting.

In the semiconductor integrated circuit of the present invention, the input buffer 22 is constructed using the differential amplifier 3 which employs the constant-current generator 32 as the current source. Therefore, the output timing of the internal clock signal CLKIN amplified by the differential amplifier 3 can be held constant irrespective of the shifting in the ground voltage VSS. As a result, the timing margin of the circuitry can be prevented from narrowing.

Figure 8:
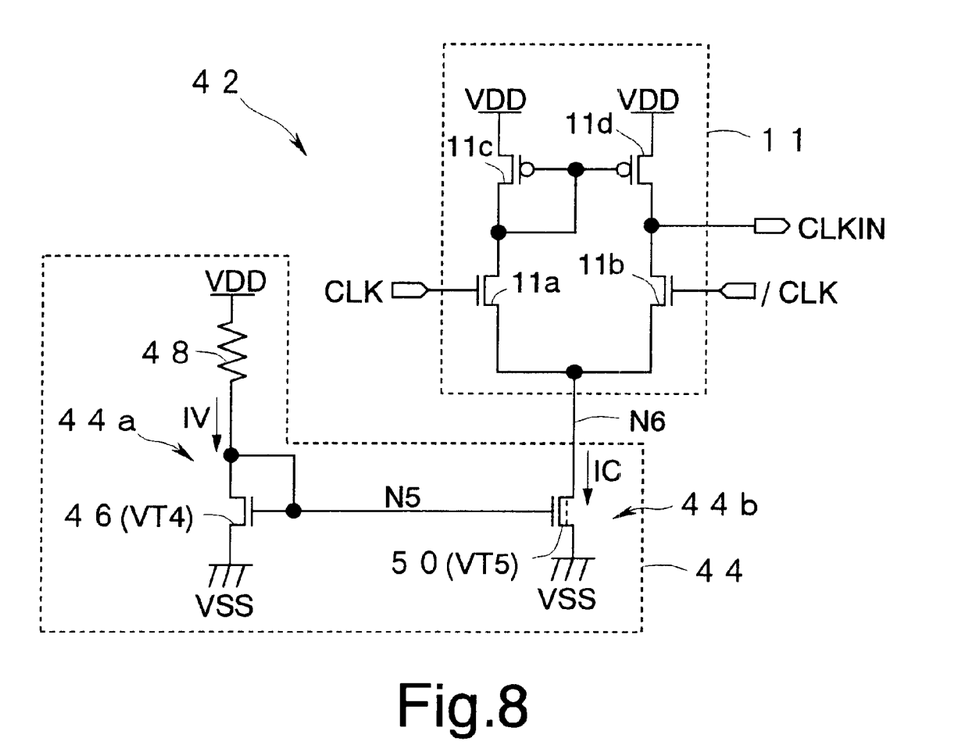
FIG. 8 is a circuit diagram showing an input buffer of the second embodiment of the present invention.

FIG. 8 shows the details of an input buffer 42 in the second embodiment of the constant-current generator, the differential amplifier and the semiconductor integrated circuit according to the present invention.

In this embodiment, the input buffer 42 is used instead of the input buffer 22 of the first embodiment. The remaining construction is the same as in the first embodiment described above.

The input buffer 42 comprises a constant-current generator 44 including a bias part 44a and a driver part 44b, and a differential amplifier 11. The differential amplifier 11 is the same circuit as the prior-art differential amplifier 11 shown in FIG. 2.

The bias part 44a of the input buffer 42 is formed of an nMOS 46, and a resistor 48 having a high resistance. The nMOS 46 corresponds to the bias transistor, while the resistor 48 corresponds to the voltage generator. The threshold voltage of the nMOS 46 is set at a value VT4. The nMOS 46 has its source connected to a ground line VSS, and has its drain and gate connected to a node N5. The resistor 48 has its one end connected to the node N5, and has its other end connected to a power supply voltage VDD. This resistor 48 is formed using, for example, a p-type diffusion layer. The resistance of the resistor 48 is set higher to some extent relative to the on-resistance of the nMOS 46. Concretely, the resistance of the resistor 48 is set so that the voltage V5 of the node N5 may become slightly higher than a value "(Power supply voltage VDD)−(Threshold voltage |VT4|)".

The driver part 44b is formed of an nMOS 50. The nMOS 50 corresponds to the outputting transistor. This nMOS 50 has its source connected to the ground line VSS, has its gate connected to the node N5, and has its drain connected to a node N6 being the common source of the differential amplifier 11. The threshold voltage VT5 of the nMOS 50 is lower than that VT4 of the nMOS 46. The threshold voltage VT5 of the nMOS 50 is adjusted by, for example, implanting the ions of arsenic or the like into the channel area of this nMOS before forming the gate thereof. In addition, the threshold voltages VT4, VT5 can be adjusted by changing the channel lengths of the respective nMOSs 46, 50. Since the nMOS 50 fed the voltage V5 at the gate has its threshold voltage VT5 set lower, it has a predetermined current supplying capability with little "margin α" having hitherto been necessary for the voltage V5. Moreover, due to the lower threshold voltage VT5, the voltage V5 can approach the ground voltage VSS by setting the resistance of the resistor 48 higher. Therefore, the voltage V5 is less affected by the shifting in the power supply voltage VDD.

The common source of the nMOSs 11a, 11b of the differential amplifier 11 is connected to the node N6. The gates of the nMOSs 11a, 11b receive the clock signals CLK, /CLK, respectively. The gate and drain of the PMOS 11c of the differential amplifier 11 are connected to each other. The common drain of the nMOS 11b and the pMOS 11d of the differential amplifier 11 outputs the internal clock signal CLKIN.

The input buffer 42 is such a circuit that the pMOSs and nMOSs of the input buffer 22 in the first embodiment are replaced with each other, and that the power supply voltage VDD and the ground voltage VSS are replaced with each other.

In this embodiment, the similar effects to the first embodiment above can also be obtained.

Figure 9:
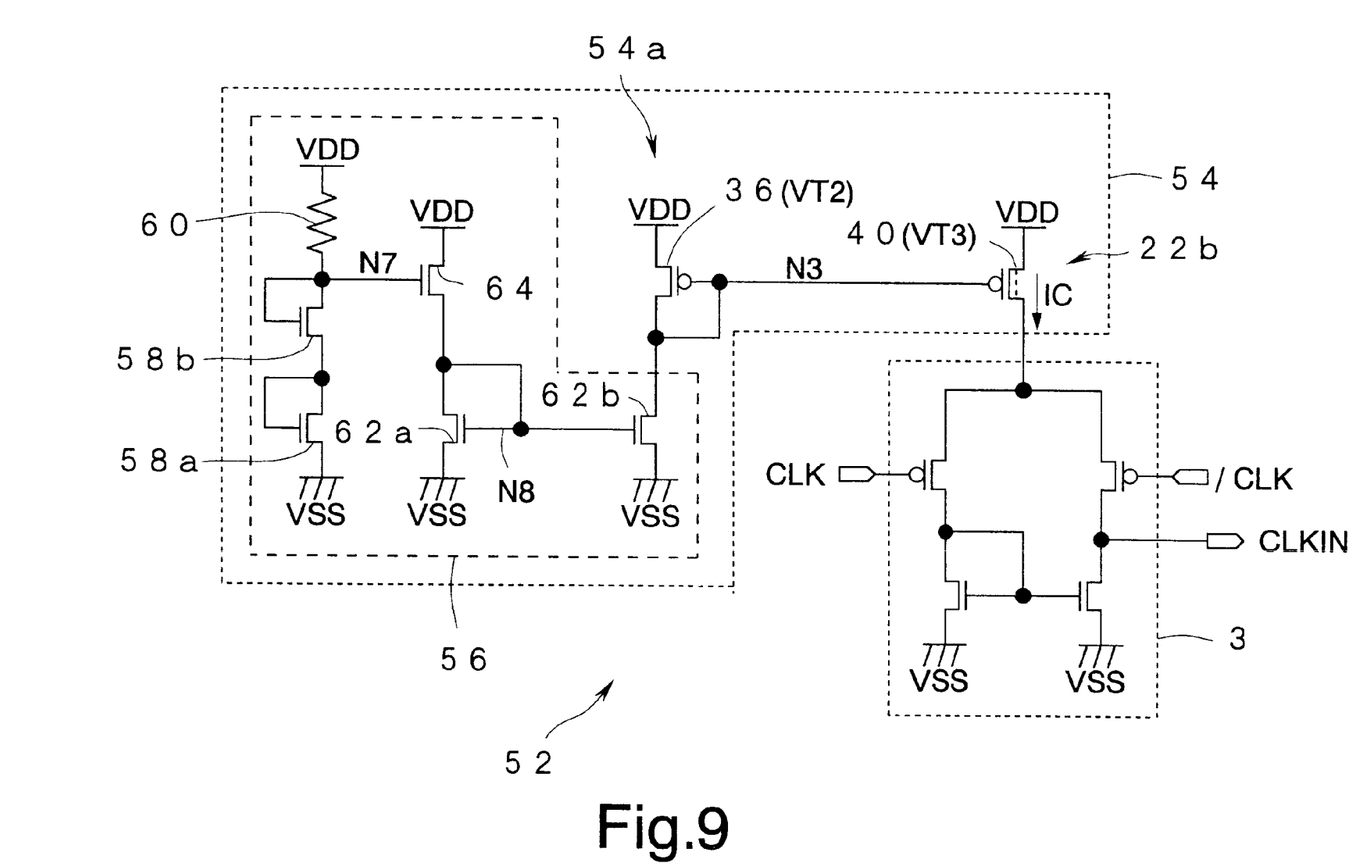
FIG. 9 is a circuit diagram showing an input buffer of the third embodiment of the present invention.

FIG. 9 shows the details of an input buffer 52 in the third embodiment of the constant-current generator, the differential amplifier and the semiconductor integrated circuit according to the present invention.

In this embodiment, the input buffer 52 is used instead of the input buffer 22 of the first embodiment described above. The remaining construction is the same as in the first embodiment.

The input buffer 52 comprises a constant-current generator 54 including a bias part 54a and a driver part 22b, and a differential amplifier 3. The driver part 22b and the differential amplifier 3 are the same circuits as in the first embodiment. A voltage controlling unit 56 is formed in the bias part 54a of the constant-current generator 54, instead of the resistor 38 in the first embodiment.

The voltage controlling unit 56 is formed of two nMOSs 58a and 58b which are in diode connection, a resistor 60 which has a high resistance, nMOSs 62a and 62b which constitute a current mirror circuit, and an nMOS 64 which controls the current of the current mirror circuit. The source of the nMOS 58a is connected to a ground line VSS. The drain of the nMOS 58b is connected to a node N7. The resistor 60 has its one end connected to a power supply line VDD, and has its other end connected to the node N7. The nMOS 62a has its source connected to the ground line VSS, and has its gate and drain connected to a node N8. The nMOS 62b has its source connected to the ground line VSS, has its gate connected to the node N8, and has its drain connected to the drain and gate of a pMOS 36. The nMOS 64 has its drain connected to the power supply line VDD, has its gate connected to the node N7, and has its source connected to the node N8. The threshold voltages of the pMOS 36 and a pMOS 40 are the same threshold voltages VT2 and VT3 as in the first embodiment, respectively.

Next, the operation of the input buffer 52 will be described.

The voltage V7 of the node N7 is the sum of the threshold voltages of the nMOSs 58a, 58b. In a case where the ground voltage VSS has shifted due to noise arising under the influence of the operation of the circuitry or the like, the voltage V7 rises or falls in correspondence with the amount of the shifting. The voltage V8 of the node N8 is determined by the ratio between the on-resistances of the nMOSs 62a, 64. In this embodiment, the characteristics of the nMOS 64 are determined so that the voltage V8 may shift in correspondence with the amount of the shifting in the ground voltage VSS. Therefore, the gate-to-source voltages of the nMOSs 62a, 62b are held constant irrespective of the shifting in the ground voltage VSS. Accordingly, the nMOS 62b operates as a constant-current source. As a result, the voltage V3 of a node N3 and a supply current IC are always kept constant irrespective of the shifting in the ground voltage VSS. Besides, the differential amplifier 3 receives clock signals CLK, /CLK and outputs a differentially amplified signal as an internal clock signal CLKIN.

In this embodiment, the similar effects to those of the above-described first embodiment can be obtained.

Further, in this embodiment, the voltage controlling unit 56 is formed to hold the voltage V3 of the node N3 constant irrespective of the shifting in the ground voltage VSS. Therefore, the supply current IC more stabilized can be fed to the differential amplifier 3.

Figure 10A:
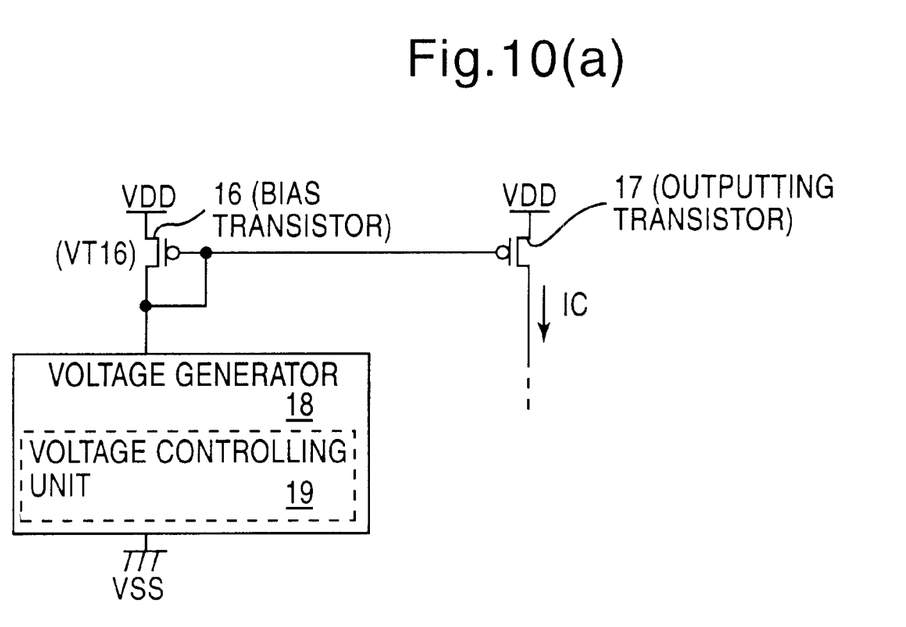
FIGS. 10a and 10b are block diagrams showing the basic principle of the fourth embodiment of the present invention.
Figure 10B:
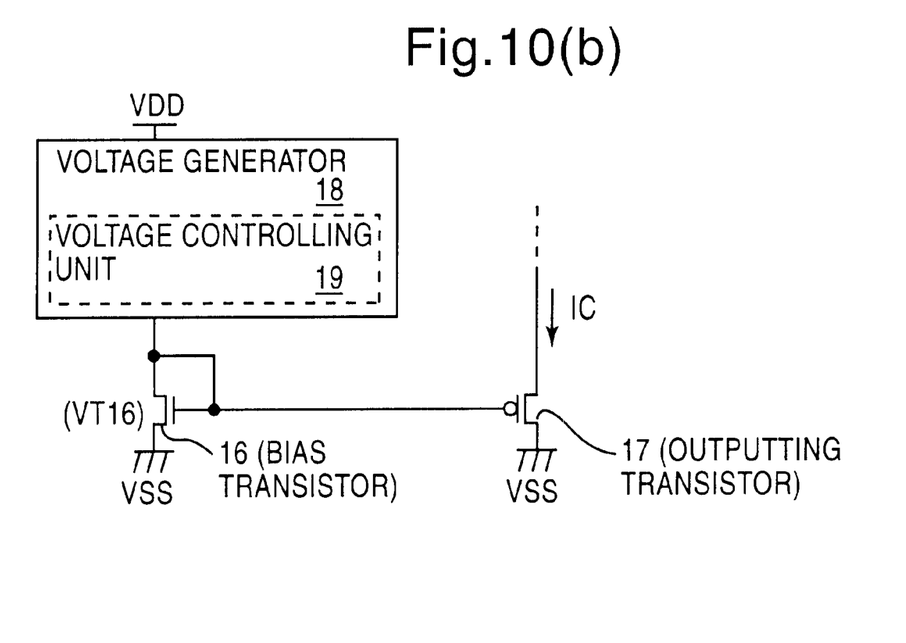

FIGS. 10a and 10b are block diagrams showing the basic principle of the fourth embodiment of a constant-current generator, the differential amplifier and the semiconductor integrated circuit according to the present invention. In FIG. 10a, the circuit is preferably constructed by pMOS transistors. In FIG. 10b, the circuit is preferably constructed by nMOS transistors.

The constant-current generator comprises a bias transistor 16 whose drain and gate are connected to each other, an outputting transistor 17, and a voltage generator 18 which is connected to the drain of the bias transistor 16. The outputting transistor 17 is fed the same source voltage and the same gate voltage as those of the bias transistor 16. The voltage generator 18 supplies a predetermined voltage to the drain of the bias transistor 16 so as to set the drain-to-source voltage of the bias transistor 16 slightly larger than the threshold voltage VT16 thereof. Further, the voltage controlling unit 19 of the voltage generator 18 prevents the drain voltage of the bias transistor 16 from shifting due to the shifting in a power supply voltage VDD or VSS.

Figure 11:
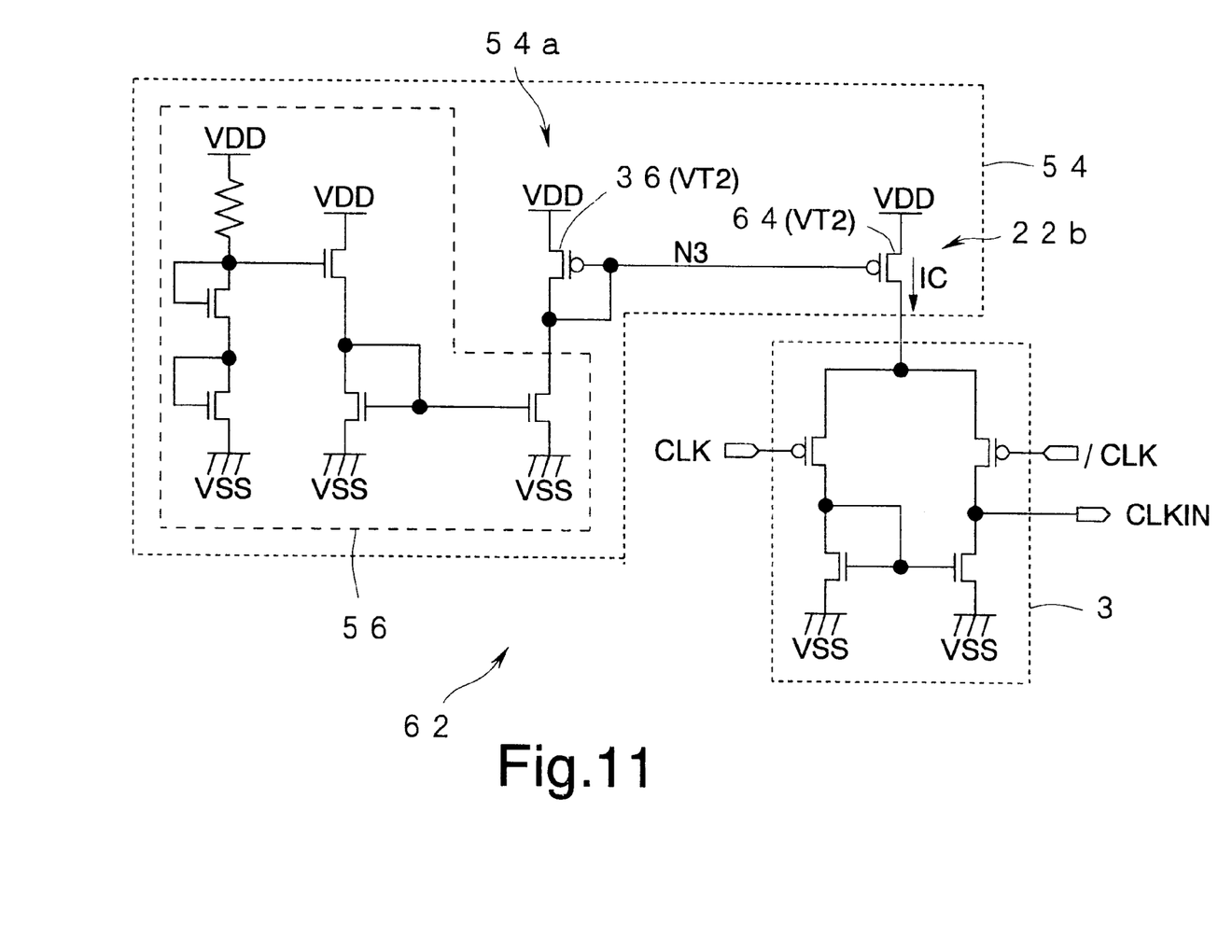
FIG. 11 is a circuit diagram showing an input buffer in the fourth embodiment.

FIG. 11 shows the details of an input buffer 62 in the fourth embodiment of the constant-current generator, the differential amplifier and the semiconductor integrated circuit according to the present invention.

The input buffer 62 of this embodiment includes a pMOS 64 instead of the pMOS 40 of the driver part 22b in the third embodiment described before. The threshold voltage of the PMOS 64 is equalized to that VT2 of the pMOS 36 of a bias part 54a. The remaining construction is the same as in the third embodiment.

In this embodiment, the similar effects to those of the foregoing third embodiment can be obtained.

Further, in this embodiment, the voltage V3 of a node N3 is held constant irrespective of the shifting in a ground voltage VSS by a voltage controlling unit 56. In spite of equalizing the threshold voltage of the pMOS 64 to that VT2 of the pMOS 36, the pMOS 64 can feed a sufficient supply current IC to a differential amplifier 3.

Since the threshold voltage of the pMOS 64 can be equalized to that VT2 of the pMOS 36, a driver part 22b can be less affected by the parameter fluctuations by using the same transistors as the pMOSs 36, 64. As a result, the input buffer 62 operates stably.

Figure 12:
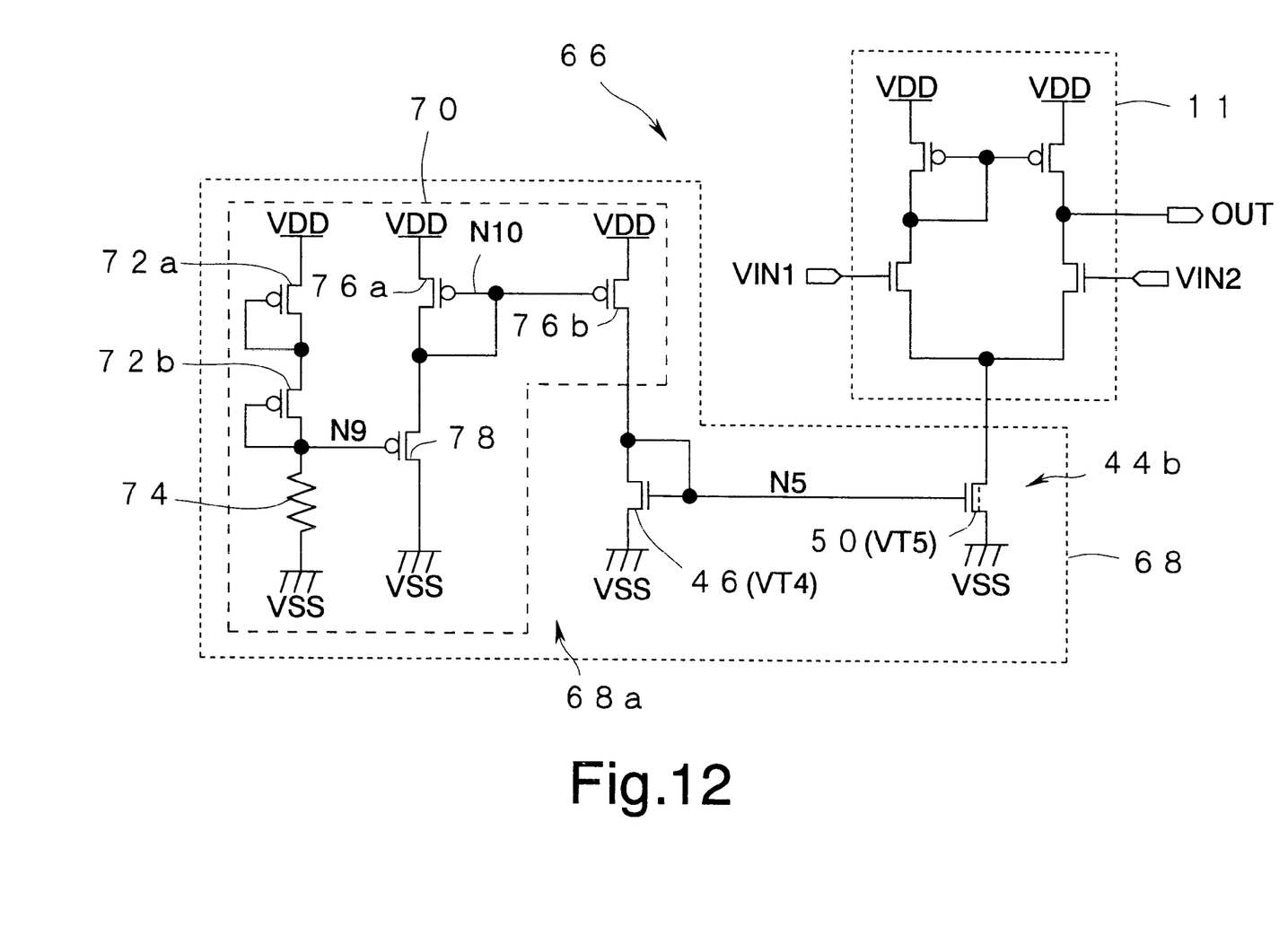
FIG. 12 is a circuit diagram showing an input buffer in the fifth embodiment of the present invention.

FIG. 12 shows the details of an input buffer 66 in the fifth embodiment of the constant-current generator, the differential amplifier and the semiconductor integrated circuit according to the present invention.

The input buffer 66 of this embodiment is such a circuit that the pMOSs and nMOSs of the input buffer 52 in the foregoing third embodiment are replaced with each other, and that the power supply voltage VDD and the ground voltage VSS are replaced with each other.

The input buffer 66 comprises a constant-current generator 68 including a bias part 68a, a driver part 44b, and a differential amplifier 11. The driver part 44b and the differential amplifier 11 are the same circuits as in the second embodiment. A voltage controlling unit 70 is formed in the bias part 68a of the constant-current generator 68, instead of the resistor 48 in the second embodiment.

The voltage controlling unit 70 is formed of two pMOSs 72a and 72b which are in diode connection, a resistor 74 which has a high resistance, pMOSs 76a and 76b which constitute a current mirror circuit, and a pMOS 78 which controls a current flowing through the current mirror circuit. The source of the PMOS 72a is connected to a power supply line VDD. The drain of the pMOS 72b is connected to a node N9. The resistor 74 has its one end connected to a ground line VSS, and has its other end connected to the node N9. The pMOS 76a has its source connected to the power supply line VDD, and has its gate and drain connected to a node N10. The pMOS 76b has its source connected to the power supply line VDD, has its gate connected to the node N10, and has its drain connected to the drain and gate (a node N5) of an nMOS 46. The pMOS 78 has its drain connected to the ground line VSS, has its gate connected to the node N9, and has its source connected to the node N10. The threshold voltages of the nMOS 46 and an nMOS 50 are the same threshold voltages VT4 and VT5 as in the second embodiment, respectively.

In this embodiment, the similar effects to those of the foregoing first and third embodiments can be obtained.

In the embodiments described above, the present invention has been applied to the DDR-SDRAM, however, it is not limited to the example. The invention can also be applied to an SDRAM, a microcomputer, a system LSI, or the like. Especially, when applied to a semiconductor integrated circuit which accepts input signals at high speed, the present invention obtains great effects.

Figure 13:
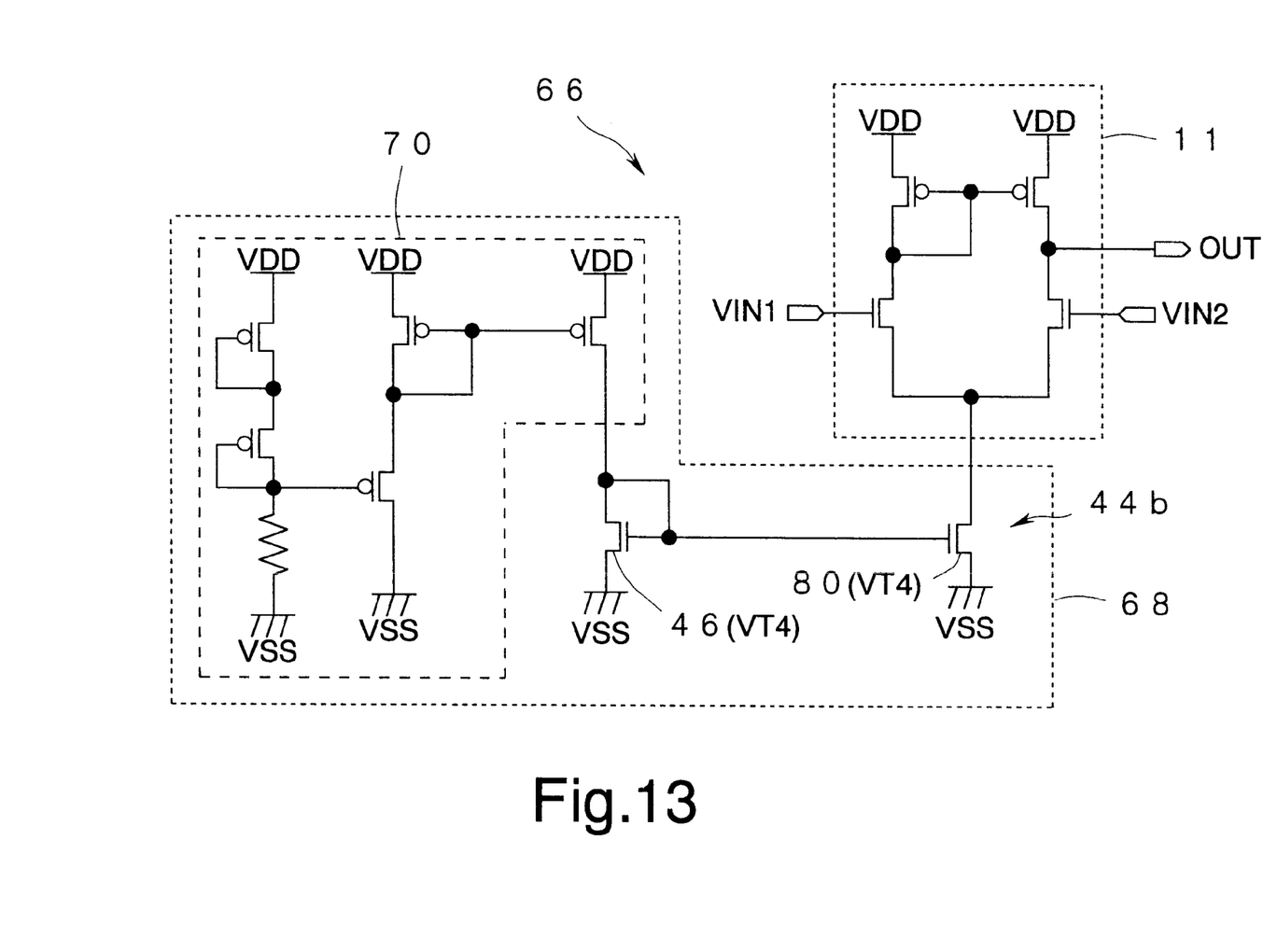
FIG. 13 is a circuit diagram showing an input buffer in a modified embodiment.

In the fifth embodiment described above, the present invention has been applied to the example in which the threshold voltage VT5 of the nMOS 50 of the driver part 44b is set lower than that VT4 of the nMOS 46. However, the present invention is not limited to the example. The driver part 44b may well be formed with an nMOS 80 having the same threshold voltage VT4 as that of the nMOS 46, as shown in FIG. 13.

The invention is not limited to the above embodiments and various modifications are possible without departing from the spirit and scope of the invention. Any improvements may be made in part or all of the components.

What is claimed is:

1. A constant-current generator comprising:
   a bias transistor having a drain and a gate connected to each other and an outputting transistor supplied with the same source voltage and the same gate voltage as those of said bias transistor, said outputting transistor having a channel length shorter than that of said bias transistor wherein the threshold voltage of said outputting transistor is smaller than that of said bias transistor; and a voltage generator connected to said drain of said bias transistor and setting a drain-to-source voltage of said bias transistor to be larger than the threshold voltage of the bias transistor.

2. A constant-current generator according to claim 1, wherein said voltage generator comprises a resistor.

3. A constant-current generator according to claim 1, wherein said voltage generator comprises:

a voltage controlling unit for preventing a drain voltage of said bias transistor from shifting due to a shifting of a power source voltage.

4. The constant-current generator according to claim 1, wherein said a voltage generator includes a voltage controlling unit connected to said drain of said bias transistor, and prevents a drain voltage of said bias transistor from shifting due to a shifting of a power source voltage.

5. A differential amplifier using a constant-current generator as a constant-current source, wherein said constant-current generator comprises:

a bias transistor having a drain and a gate connected to each other and an outputting transistor supplied with the same source voltage and the same gate voltage as those of said bias transistor, said outputting transistor having a channel length shorter than that of said bias transistor wherein the threshold voltage of said outputting transistor is smaller than that of said bias transistor; and wherein said constant-current generator further comprises a voltage generator connected to said drain of said bias transistor and sets a drain-to-source voltage of said bias transistor to be larger than the threshold voltage of the bias transistor.

6. A differential amplifier according to claim 5, wherein said voltage generator includes a voltage controlling unit connected to said drain of said bias transistor, and prevents a drain voltage of said bias transistor from shifting due to a shifting of a power source voltage.

7. A semiconductor integrated circuit having a differential amplifier using a constant-current generator as a constant-current source, wherein said constant-current generator comprises:

a bias transistor having a drain and a gate connected to each other and an outputting transistor supplied with the same source voltage and the same gate voltage as those of said bias transistor, said outputting transistor having a channel length shorter than that of said bias transistor wherein the threshold voltage of said outputting transistor is smaller than that of said bias transistor; and wherein said constant-current generator further comprises a voltage generator connected to said drain of said bias transistor and sets a drain-to-source voltage of said bias transistor to be larger than the threshold voltage of the bias transistor.

8. The semiconductor integrated circuit according to claim 7, wherein said voltage generator includes a voltage controlling unit connected to said drain of said bias transistor, and prevents a drain voltage of said bias transistor from shifting due to a shifting of a power source voltage.

* * * * *